(12) United States Patent
Wallace et al.

(10) Patent No.: US 8,586,209 B2
(45) Date of Patent: Nov. 19, 2013

(54) OPTO-ELECTRICAL DEVICES AND METHODS OF MANUFACTURING THE SAME

(75) Inventors: Paul Wallace, Roytson (GB); Simon Goddard, Impington (GB); Ilaria Grizzi, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 24 days.

(21) Appl. No.: 13/058,752

(22) PCT Filed: Aug. 14, 2009

(86) PCT No.: PCT/GB2009/002005
§ 371 (c)(1),
(2), (4) Date: Apr. 14, 2011

(87) PCT Pub. No.: WO2010/018388
PCT Pub. Date: Feb. 18, 2010

(65) Prior Publication Data
US 2011/0186832 A1  Aug. 4, 2011

(30) Foreign Application Priority Data
Aug. 15, 2008  (GB) .................................. 0814971.8

(51) Int. Cl.
*H01L 51/54* (2006.01)
*H01L 51/56* (2006.01)
*C09K 11/06* (2006.01)

(52) U.S. Cl.
USPC . 428/690; 428/917; 252/301.16; 252/301.35; 257/40; 257/E51.032; 257/E51.036; 257/E51.044; 313/504; 313/506; 438/46; 524/315; 524/375; 524/403

(58) Field of Classification Search
USPC ........ 524/315, 375, 403; 252/301.16, 301.35; 257/40, E51.032, E51.036, E51.044; 313/504, 506; 438/46; 428/690, 917
See application file for complete search history.

(56) References Cited

U.S. PATENT DOCUMENTS

| | | | |
|---|---|---|---|
| 4,539,507 | A | 9/1985 | VanSlyke et al. |
| 5,150,006 | A | 9/1992 | Van Slyke et al. |
| 5,432,014 | A | 7/1995 | Sano et al. |
| 5,621,131 | A | 4/1997 | Kreuder et al. |
| 6,083,634 | A | 7/2000 | Shi |

(Continued)

FOREIGN PATENT DOCUMENTS

| | | |
|---|---|---|
| EP | 0 707 020 | 4/1996 |
| EP | 0 842 208 | 5/1998 |

(Continued)

OTHER PUBLICATIONS

Baldo et al., "Very high-efficiency green organic light-emitting devices based on electrophosphorescence," *Applied Physics Letters*, 75:4-6 (1999).

(Continued)

*Primary Examiner* — Vu A Nguyen
(74) *Attorney, Agent, or Firm* — Marshall, Gerstein & Borun LLP (57) ABSTRACT

An improved composition for ink jet printing an opto-electrical device, which composition comprises a solution-processable host material and a metal complex, wherein the viscosity of the composition exceeds 12 mPa·s at 20° C.

6 Claims, 4 Drawing Sheets

(56) References Cited

U.S. PATENT DOCUMENTS

| | | |
|---|---|---|
| 6,353,083 B1 | 3/2002 | Inbasekaran et al. |
| 6,372,154 B1 | 4/2002 | Li |
| 6,878,312 B1 | 4/2005 | Kanbe et al. |
| 7,030,138 B2 | 4/2006 | Fujimoto et al. |
| 7,094,477 B2 | 8/2006 | Kamatani et al. |
| 7,125,998 B2 | 10/2006 | Stossel et al. |
| 7,147,935 B2 | 12/2006 | Kamatani et al. |
| 7,238,435 B2 | 7/2007 | Kamatani et al. |
| 7,638,594 B2 | 12/2009 | Becker et al. |
| 2002/0117662 A1 | 8/2002 | Nii |
| 2002/0182441 A1 | 12/2002 | Lamansky et al. |
| 2004/0109955 A1 | 6/2004 | Kitano et al. |
| 2004/0133004 A1 | 7/2004 | Stossel et al. |
| 2004/0144975 A1 | 7/2004 | Seki et al. |
| 2007/0248746 A1 | 10/2007 | Ito et al. |
| 2008/0100199 A1 | 5/2008 | Sekine et al. |
| 2009/0146164 A1* | 6/2009 | Tierney et al. ............ 257/98 |
| 2011/0068304 A1 | 3/2011 | Parham et al. |

FOREIGN PATENT DOCUMENTS

| | | |
|---|---|---|
| EP | 0 880 303 | 11/1998 |
| EP | 0 989 778 | 3/2000 |
| EP | 1 245 659 | 10/2002 |
| EP | 1 469 057 A2 | 10/2004 |
| EP | 1 932 866 A1 | 6/2008 |
| EP | 1 950 816 A1 | 7/2008 |
| JP | 2002-324679 | 11/2002 |
| WO | WO-90/13148 | 11/1990 |
| WO | WO-95/06400 | 3/1995 |
| WO | WO-99/21935 | 5/1999 |
| WO | WO-99/48160 | 9/1999 |
| WO | WO-00/59267 A1 | 10/2000 |
| WO | WO-01/16251 A1 | 3/2001 |
| WO | WO-01/19142 | 3/2001 |
| WO | WO-01/62869 | 8/2001 |
| WO | WO-01/81649 | 11/2001 |
| WO | WO-01/96454 A1 | 12/2001 |
| WO | WO-02/18513 A1 | 3/2002 |
| WO | WO-02/31896 | 4/2002 |
| WO | WO-02/44189 | 6/2002 |
| WO | WO-02/45466 | 6/2002 |
| WO | WO-02/066552 | 8/2002 |
| WO | WO-02/067343 | 8/2002 |
| WO | WO-02/068435 | 9/2002 |
| WO | WO-02/081448 | 10/2002 |
| WO | WO-03/018653 | 3/2003 |
| WO | WO-03/020790 A2 | 3/2003 |
| WO | WO-03/022908 | 3/2003 |
| WO | WO-03/083960 | 10/2003 |
| WO | WO-2004/013920 A2 | 2/2004 |
| WO | WO-2004/015025 A1 | 2/2004 |
| WO | WO-2005/013386 A2 | 2/2005 |
| WO | WO-2005/124889 A1 | 12/2005 |
| WO | WO-2006/062226 A1 | 6/2006 |
| WO | WO-2008/015426 A1 | 2/2008 |
| WO | WO-2008/067673 A1 | 6/2008 |

OTHER PUBLICATIONS

Carter et al., "Recent Developments in Materials and Processes for Ink Jet Printing High Resolution Polymer OLED Displays," *Proc. SPIE*, 4800:34-46 (2003).

Chen et al., "Recent Developments in Molecular Organic Electroluminescent Materials," *Macromol. Symp.*, 125:1-48 (1997).

Chen et al., "Triplet exciton confinement in phosphorescent polymer light-emitting diodes," *Applied Physics Letters*, 82:1006-1008 (2003).

Cleave et al., "Harvesting Singlet and Triplet Energy in Polymer LEDs," *Adv. Matter*, 11:285-288 (1999).

Duineveld et al., "Ink-Jet Printing of Polymer Light-Emitting Devices," *Proceedings of SPIE*, 4464:59-67 (2002).

Ikai et al., "Highly efficient phosphorescence from organic light-emitting devices with an exciton-block layer," *Applied Physics Letters*, 79:156-158 (2001).

Lane et al., "Origin of Electrophosphorescence from a Doped Polymer Light Emitting Diode," *Phys. Rev. B*, 63:235206-1-235206-8 (2001).

Lee et al., "Polymer phosphorescent light-emitting devices doped with tris(2-phenylpyridine) iridium as a triplet emitter," *Applied Physics Letters*, 77:2280-2282 (2000).

O'Brien et al., "Electrophosphorescence from a doped polymer light emitting diode," *Synthetic Metals*, 116:379-383 (2001).

Setayesh et al., "Bridging the Gap between Polyfluorene and Ladder-Poly-p-phenylene: Synthesis and Characterization of Poly-2,8-indenofluorene," *Macromolecules*, 33:2016-2020 (2000).

Yang, "Efficient blue polymer light-emitting diodes from a series of soluble poly(paraphenylene)s," *J. Appl. Phys.*, 79:934-939 (1996).

Yang, "Review of Recent Progress on Polymer Electroluminescent Devices," *SPIE Photonics West: Optoelectronics '98*, Conf. 3279, San Jose (1998).

Zhu et al., "Synthesis of new iridium complexes and their electrophosphorescent properties in polymer light-emitting diodes," *J. Mater. Chem.*, 13:50-55 (2003).

Combined Search and Examination Report for Application No. GB0814971.8, dated Feb. 27, 2009.

International Preliminary Report on Patentability for Application No. PCT/GB2009/002005, dated Feb. 15, 2011.

International Search Report and Written Opinion for Application No. PCT/GB2009/002005, dated Jan. 14, 2010.

* cited by examiner

OPTO-ELECTRICAL DEVICES AND METHODS OF MANUFACTURING THE SAME

FIELD OF INVENTION

This invention relates to compositions for ink jet printing opto-electrical devices, opto-electrical devices manufactured using these compositions, and methods of manufacturing these opto-electrical devices.

BACKGROUND OF INVENTION

One class of opto-electrical devices is that using an organic material for light emission (or detection in the case of photovoltaic cells and the like). The basic structure of these devices is a light emissive organic layer, for instance a film of a poly (p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO90/13148 the organic light-emissive material is a polymer. In U.S. Pat. No. 4,539,507 the organic light-emissive material is of the class known as small molecule materials, such as (8-hydroxyquinoline) aluminium ("Alq3"). In a practical device one of the electrodes is transparent, to allow the photons to escape the device.

A typical organic light-emissive device ("OLED") is fabricated on a glass or plastic substrate coated with a transparent anode such as indium-tin-oxide ("ITO"). A layer of a thin film of at least one electroluminescent organic material covers the first electrode. Finally, a cathode covers the layer of electroluminescent organic material. The cathode is typically a metal or alloy and may comprise a single layer, such as aluminium, or a plurality of layers such as calcium and aluminium.

In operation, holes are injected into the device through the anode and electrons are injected into the device through the cathode. The holes and electrons combine in the organic electroluminescent layer to form an exciton which then undergoes radiative decay to give light (in light detecting devices this process essentially runs in reverse).

These devices have great potential for displays. However, there are several significant problems. One is to make the device efficient, particularly as measured by its external power efficiency and its external quantum efficiency. Another is to optimise (e.g. to reduce) the voltage at which peak efficiency is obtained. Another is to stabilise the voltage characteristics of the device over time. Another is to increase the lifetime of the device.

To this end, numerous modifications have been made to the basic device structure described above in order to solve one or more of these problems.

One such modification is the provision of a layer of conductive polymer between the light-emissive organic layer and one of the electrodes. It has been found that the provision of such a conductive polymer layer can improve the turn-on voltage, the brightness of the device at low voltage, the efficiency, the lifetime and the stability of the device. In order to achieve these benefits these conductive polymer layers typically may have a sheet resistance less than $10^6$ Ohms/square, the conductivity being controllable by doping of the polymer layer. It may be advantageous in some device arrangements not to have too high a conductivity. For example, if a plurality of electrodes are provided in a device but only one continuous layer of conductive polymer extending over all the electrodes, then too high a conductivity can lead to lateral conduction (known as "cross-talk) and shorting between electrodes.

The conductive polymer layer may also be selected to have a suitable workfunction so as to aid in hole or electron injection and/or to block holes or electrons. There are thus two key electrical features: the overall conductivity of the conductive polymer composition; and the workfunction of the conductive polymer composition. The stability of the composition and reactivity with other components in a device will also be critical in providing an acceptable lifetime for a practical device. The processability of the composition will be critical for ease of manufacture.

Conductive polymer formulations are discussed in the applicant's earlier application GB-A-0428444.4. There is an ongoing need to optimise the organic formulations used in these devices both in the light emitting layer and the conductive polymer layer.

OLEDs can provide a particularly advantageous form of electro-optic display. They are bright, colourful, fast-switching, provide a wide viewing angle and are easy and cheap to fabricate on a variety of substrates. Organic (which here includes organometallic) LEDs may be fabricated using either polymers or small molecules in a range of colours (or in multi-coloured displays), depending upon the materials used. As previously described, a typical OLED device comprises two layers of organic material, one of which is a layer of light emitting material such as a light emitting polymer (LEP), oligomer or a light emitting low molecular weight material, and the other of which is a conductive polymer layer, for example a layer of a hole transporting material such as a polythiophene derivative or a polyaniline derivative.

Organic LEDs may be deposited on a substrate in a matrix of pixels to form a single or multi-colour pixellated display. A multicoloured display may be constructed using groups of red, green, and blue emitting pixels. So-called active matrix displays have a memory element, typically a storage capacitor and a transistor, associated with each pixel whilst passive matrix displays have no such memory element and instead are repetitively scanned to give the impression of a steady image.

Figure 1:
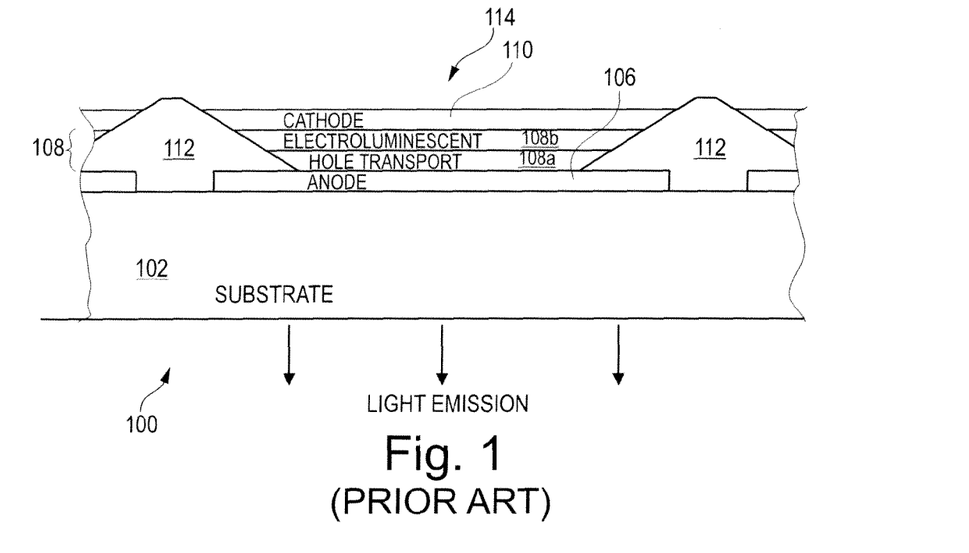
FIG. 1 shows a vertical cross section through an example of an OLED device.

FIG. 1 shows a vertical cross section through an example of an OLED device 100. In an active matrix display, part of the area of a pixel is occupied by associated drive circuitry (not shown in FIG. 1). The structure of the device is somewhat simplified for the purposes of illustration.

The OLED 100 comprises a substrate 102, typically 0.7 mm or 1.1 mm glass but optionally clear plastic, on which an anode layer 106 has been deposited. The anode layer typically comprises around 150 nm thickness of ITO (indium tin oxide), over which is provided a metal contact layer, typically around 500 nm of aluminium, sometimes referred to as anode metal. Glass substrates coated with ITO and contact metal may be purchased from Corning, USA. The contact metal (and optionally the ITO) is patterned as desired so that it does not obscure the display, by a conventional process of photolithography followed by etching.

A substantially transparent hole transport layer 108a is provided over the anode metal, followed by an electroluminescent layer 108b. Banks 112 may be formed on the substrate, for example from positive or negative photoresist material, to define wells 114 into which these active organic layers may be selectively deposited, for example by a droplet deposition or ink jet printing technique. The wells thus define light emitting areas or pixels of the display.

A cathode layer 110 is then applied by, say, physical vapour deposition. The cathode layer typically comprises a low work function metal such as calcium or barium covered with a thicker, capping layer of aluminium and optionally including an additional layer immediately adjacent the electroluminescent layer, such as a layer of lithium fluoride, for improved electron energy level matching. The cathode may be transparent. This is particularly preferred for active matrix devices wherein emission through the substrate is partially blocked by drive circuitry located underneath the emissive pixels. In the case of a transparent cathode device, it will be appreciated that the anode is not necessarily transparent. In the case of passive matrix displays, mutual electrical isolation of cathode lines may achieved through the use of cathode separators (element 302 of FIG. 3b). Typically a number of displays are fabricated on a single substrate and at the end of the fabrication process the substrate is scribed, and the displays separated. An encapsulant such as a glass sheet or a metal can is utilized to inhibit oxidation and moisture ingress.

Organic LEDs of this general type may be fabricated using a range of materials including polymers, dendrimers, and so-called small molecules, to emit over a range of wavelengths at varying drive voltages and efficiencies. Examples of polymer-based OLED materials are described in WO90/13148, WO95/06400 and WO99/48160; examples of dendrimer-based materials are described in WO 99/21935 and WO 02/067343; and examples of small molecule OLED materials are described in U.S. Pat. No. 4,539,507. The aforementioned polymers, dendrimers and small molecules emit light by radiative decay of singlet excitons (fluorescence). However, up to 75% of excitons are triplet excitons which normally undergo non-radiative decay. Electroluminescence by radiative decay of triplet excitons (phosphorescence) is disclosed in, for example, "Very high-efficiency green organic light-emitting devices based on electrophosphorescence" M. A. Baldo, S. Lamansky, P. E. Burrows, M. E. Thompson, and S. R. Forrest *Applied Physics Letters*, Vol. 75(1) pp. 4-6, Jul. 5, 1999". In the case of a polymer-based OLED, layers 108 comprise a hole injection layer 108a and a light emitting polymer (LEP) electroluminescent layer 108b. The electroluminescent layer may comprise, for example, around 70 nm (dry) thickness of PPV (poly(p-phenylenevinylene)) and the hole injection layer, which helps match the hole energy levels of the anode layer and of the electroluminescent layer, may comprise, for example, around 50-200 nm, preferably around 150 nm (dry) thickness of PEDOT:PSS (polystyrene-sulphonate-doped polyethylene-dioxythiophene).

Figure 2:
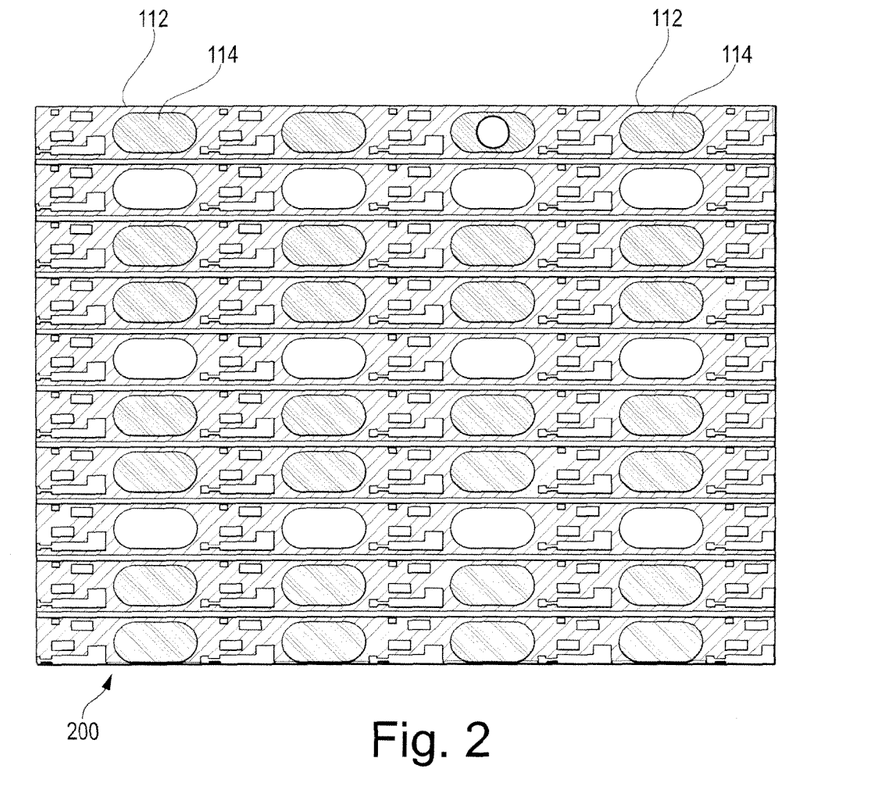
FIG. 2 shows a view from above of a portion of a three colour pixelated OLED display.

FIG. 2 shows a view from above (that is, not through the substrate) of a portion of a three-colour active matrix pixellated OLED display 200 after deposition of one of the active colour layers. The figure shows an array of banks 112 and wells 114 defining pixels of the display.

Figure 3A:
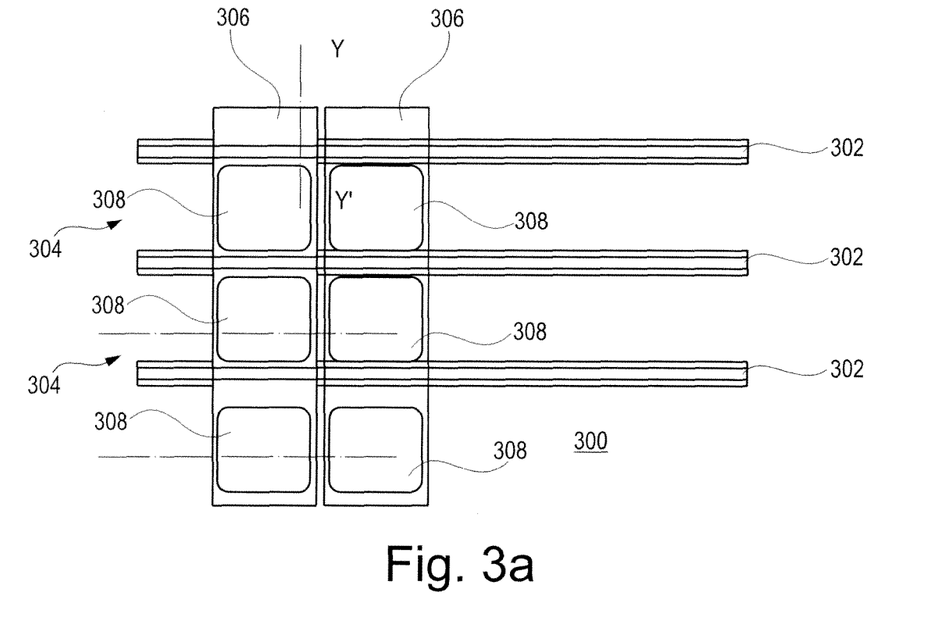
FIGS. 3a and 3b show a view from above and a cross-sectional view respectively of a passive matrix OLED display.
Figure 3B:
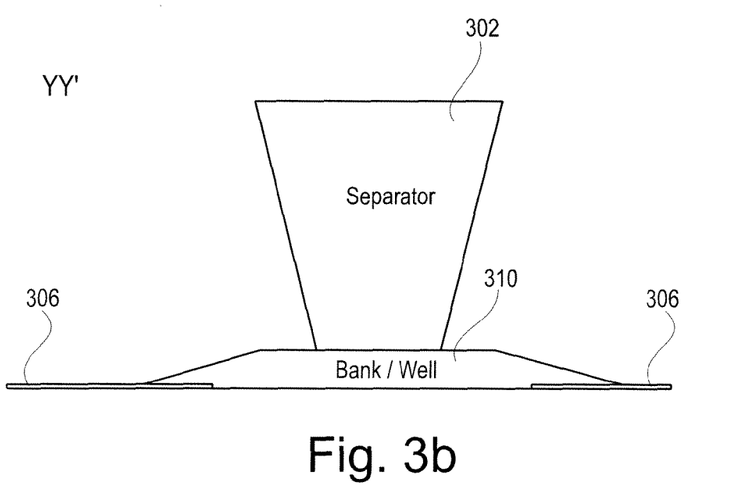

FIG. 3a shows a view from above of a substrate 300 for ink jet printing a passive matrix OLED display. FIG. 3b shows a cross-section through the substrate of FIG. 3a along line Y-Y'.

Referring to FIGS. 3a and 3b, the substrate is provided with a plurality of cathode undercut separators 302 to separate adjacent cathode lines (which will be deposited in regions 304). A plurality of wells 308 is defined by banks 310, constructed around the perimeter of each well 308 and leaving an anode layer 306 exposed at the base of the well. The edges or faces of the banks are tapered onto the surface of the substrate as shown, heretofore at an angle of between 10 and 40 degrees. The banks present a hydrophobic surface in order that they are not wetted by the solution of deposited organic material and thus assist in containing the deposited material within a well. This is achieved by treatment of a bank material such as polyimide with an $O_2/CF_4$ plasma as disclosed in EP 0989778. Alternatively, the plasma treatment step may be avoided by use of a fluorinated material such as a fluorinated polyimide as disclosed in WO 03/083960.

As previously mentioned, the bank and separator structures may be formed from resist material, for example using a positive (or negative) resist for the banks and a negative (or positive) resist for the separators; both these resists may be based upon polyimide and spin coated onto the substrate, or a fluorinated or fluorinated-like photoresist may be employed. In the example shown the cathode separators are around 5 μm in height and approximately 20 μm wide. Banks are generally between 20 μm and 100 μm in width and in the example shown have a 4 μm taper at each edge (so that the banks are around 1 μm in height). The pixels of FIG. 3a are approximately 300 μm square but, as described later, the size of a pixel can vary considerably, depending upon the intended application.

The deposition of material for organic light emitting diodes (OLEDs) using ink jet printing techniques is described in a number of documents including, for example: Y. Yang, "Review of Recent Progress on Polymer Electroluminescent Devices," *SPIE Photonics West: Optoelectronics '98*, Conf. 3279, San Jose, January, 1998; EP 0 880 303; and "Ink-Jet Printing of Polymer Light-Emitting Devices", Paul C. Duineveld, Margreet M. de Kok, Michael Buechel, Aad H. Sempel, Kees A. H. Mutsaers, Peter van de Weijer, Ivo G. J. Camps, Ton J. M. van den Biggelaar, Jan-Eric J. M. Rubingh and Eliav I. Haskal, Organic Light-Emitting Materials and Devices V, Zakya H. Kafafi, Editor, Proceedings of SPIE Vol. 4464 (2002). Ink jet techniques can be used to deposit materials for both small molecule and polymer LEDs. Ink jet printing is suggested, for example, in WO2005/013386.

A volatile solvent is generally employed to deposit a molecular electronic material, with 0.5% to 4% dissolved material. This can take anything between a few seconds and a few minutes to dry and results in a relatively thin film in comparison with the initial "ink" volume. Often multiple drops are deposited, preferably before drying begins, to provide sufficient thickness of dry material. Typical solvents which have been used include cyclohexylbenzene and alkylated benzenes, in particular toluene or xylene; others are described in WO 00/59267, WO 01/16251 and WO 02/18513; a solvent comprising a blend of these may also be employed. Precision ink jet printers such as machines from Litrex Corporation of California, USA are used; suitable print heads are available from Xaar of Cambridge, UK and Spectra, Inc. of NH, USA. Some particularly advantageous print strategies are described in the applicant's UK patent application number 0227778.8 filed on 28 Nov. 2002.

The feasibility of using ink jet printing to define hole conduction and electroluminescent layers in OLED display has been well demonstrated. The particular motivation for ink jet printing has been driven by the prospect of developing scalable and adaptable manufacturing processes, enabling large substrate sizes to be processed, without the requirement for expensive product specific tooling.

Recent years have seen an increasing activity in the development of ink jet printing for depositing electronic materials. In particular there have been demonstrations of ink jet printing of both hole conduction (HC) and electroluminescent (EL) layers of OLED devices by more than a dozen display manufacturers.

One drawback associated with ink jet printing is that placed on the range of compositions which may be ink jet printed. Compositions having a high solids content often have high viscosity ("solids content" as used herein means the weight by volume or by weight of solid material before being dissolved or dispersed in a solvent). This makes it difficult or impossible for these compositions to be deposited using ink jetting. Too viscous a composition will not flow through the print head arrangement used in ink jet printing. Guidance supplied by print head manufacturers stipulates that it is undesirable to attempt to print by ink jet printing compositions having a viscosity above 10 mPa·s. Inkjetting printing of compositions having a viscosity of 12 mPa·s or more at 20° C. will result in poor jetting performance, and in turn poor device quality.

This provides a problem in the construction of opto-electrical devices. Such devices will contain layers which need to be deposited as high molecular weight polymeric compositions with high solids content. For example, a light emissive layer in an electroluminescent device should preferably be deposited at a solids content of at least 1% by weight so as to achieve a layer of sufficient thickness for use in the electroluminescent device. In practice, if such a device is to be fabricated by ink jet printing, a much lower solids content needs to be employed. This means that the emissive layer has to be deposited in more than one pass of the printer head. This can have a dramatic effect on the quality of the emissive layer. Deposition in multiple passes tends to result in an uneven layer which gives rise to poor device performance.

A need therefore exists for improved compositions for ink jet printing opto-electrical devices which do not suffer from the drawbacks of the prior art.

SUMMARY OF THE INVENTION

According to a first aspect, the present invention provides a composition for ink jet printing an opto-electrical device, which composition comprises a solution-processable host material and a metal complex, wherein the viscosity of the composition exceeds 12 mPa·s at 20° C.

Preferably, the host material is a polymer.

It has surprisingly been found that compositions whose viscosity was thought to make it impossible to print by ink jet printing can be ink jet printed when a metal complex is dispersed therein. This enables compositions with high solids content to be ink jet printed in the manufacture of an opto-electrical device, thereby avoiding the need for multiple passes of the print head.

The mechanism by which the metal complex alters the ability of the composition to be ink jet printed is not understood. Attempts to print the solution-processable host material in the absence of a metal complex have been found to fail because the viscosity of the composition is too great to be printed.

The viscosity of the composition may exceed 13 mPa·s, 14 mPa·s, 15 mPa·s or even 16 mPa·s at 20° C. Compositions having a viscosity of 17 mPa·s, 18 mPa·s or even higher may be ink jet printed according to the present invention.

Generally speaking, the higher the solids content of the composition, the higher the viscosity, although viscosity may depend on other parameters such as the molecular weight of the host polymer, the extent of chain branching in the host polymer etc. The invention may usefully ink jet print a composition which has a solids content of at least 1% by weight of the composition and this enables a light emissive layer, for example, to be printed in a single pass. Preferably the solids content of the composition is at least 1.6% by weight of the composition.

As described in further detail below, the composition comprising a host material and metal complex may be used as an emissive layer in an electroluminescent device. According to this embodiment, the metal complex is an emissive metal complex which is capable of accepting excitons from the host material and emitting light by radiative decay of the excitons. The metal complex may be capable of fluorescence and/or phosphorescence when used in the electroluminescent device. Preferably, substantially all emission derived from the metal complex is phosphorescence. It will, however, be appreciated that the metal complex may not contribute to emission in the end device.

The host material may be a host polymer such as a homopolymer or a copolymer and typically comprises a semiconductive polymer which may be a charge transporting polymer which may have aromatic or heteroaromatic repeat units. When used as a host for an emissive metal complex the HOMO-LUMO bandgap of the host must be greater than that of the emissive metal complex. Where the emissive metal complex is a phosphorescent material, the triplet energy level of the host must be higher than, or at least comparable with, the triplet energy level of the emissive metal complex. It will be appreciated by those skilled in this art that the HOMO/LUMO bandgap of the host polymer may be modulated by appropriate selection of repeat units and by the extent of conjugation of the polymer.

Included in typical host polymers are those having one or more repeat units selected from optionally substituted fluorene; optionally substituted spirofluorene; optionally substituted indenofluorene; optionally substituted phenylene; optionally substituted oligo-phenylene;

in which each Ar is the same or different and independently represents an optionally substituted aryl or heteroaryl and any two Ar groups may be directly linked by a divalent group or a single bond; $-(CR^4R^5)_n-$ or $-Ar^1-(CR^4R^5)_n-Ar^2-$ in which $R^4$ and $R^5$ are independently selected from hydrogen or a substituent, n is from 1 to 10, and $Ar^1$ and $Ar^2$ are independently selected from optionally substituted aryl or heteroaryl.

Further details of host polymers and metal complexes usable in the invention are set out below.

The composition for ink jet printing according to the present invention will typically include a solvent suitable for ink jet printing which is capable of delivering the composition to its target. The solvent may dissolve the material or the material may form a dispersion in the solvent. Various solvents and solvent systems are available including optionally substituted benzenes, in particular benzenes comprising one or more substituents selected from alkyl, alkoxy groups such as $C_{1-10}$ alkylbenzene, xylene, mesitylene and alkylanisole; or benzoates as described in, for example, co-pending application GB 0813348.0.

Preferably, the composition should have a contact angle with the bank such that it wets the bank but does not flood out of the well. With this arrangement, on drying a coffee ring effect occurs resulting in a thickening of the edges. A more uniform film morphology results producing a more uniform emission in the finished device.

If the contact angle between the electroluminescent material and the conductive material is too high then the conductive material will not be sufficiently wetted by the electroluminescent material.

One solution to the problem of flooding is to select a high boiling point solvent which has a sufficient contact angle such that it is adequately contained in the wells. Conversely, one solution to the problem of insufficient wetting of the banks is to select a high boiling point solvent which does not have a high contact angle with the material of the base of the well and does not have a contact angle with the banks which is too high.

The problem of insufficient wetting or flooding can be controlled by the addition of a suitable additive to modify the contact angle such that the well is sufficiently wetted without flooding. The provision of such a additive can also produce flatter film morphologies.

According to another aspect of the present invention there is provided use of a composition, as described herein, for ink jetting a layer in the manufacture of an opto-electrical device.

According to another aspect of the present invention there is provided an opto-electrical device formed using the compositions described herein.

According to yet another aspect of the present invention there is provided a process for the manufacture of an organic light-emissive display comprising: providing a substrate comprising a first electrode layer and a bank structure defining a plurality of wells; depositing a conductive organic layer over the first electrode; depositing an organic light-emissive layer over the conductive organic layer; and depositing a second electrode over the organic light-emissive layer, wherein the organic light-emissive layer is deposited by ink jet printing a composition as described herein into the plurality of wells.

BRIEF SUMMARY OF THE DRAWINGS

Embodiments of the present invention will now be described, by way of example only, with reference to the accompanying drawings in which.

DETAILED DESCRIPTION OF PREFERRED EMBODIMENTS

The general device architecture is illustrated in FIG. 1 and has been described above.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

Suitable polymers for charge transport and emission may comprise a first repeat unit selected from arylene repeat units, in particular: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably first repeat units of formula 1:

(1)

wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

A polymer comprising the first repeat unit may provide one or more of the functions of hole transport, electron transport and emission depending on which layer of the device it is used in and the nature of co-repeat units.

Preferably, the polymer comprises arylene repeat units as described above and triarylamine repeat units. Preferred triarylamine repeat units are selected from optionally substituted repeat units of formula 2:

2 wherein $Ar^1$ and $Ar^2$ are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 2 may be substituted. Preferred substituents include alkyl and alkoxy groups. Any of the aryl or heteroaryl groups in the repeat unit of Formula 2 may be linked by a direct bond or a divalent linking atom or group. Preferred divalent linking atoms and groups include O, S; substituted N; and substituted C.

Particularly preferred units satisfying formula 2 include units of formulae 3 to 5;

wherein Ar¹ and Ar² are as defined above; and Ar³ is optionally substituted aryl or heteroaryl. Where present, preferred substituents for Ar³ include alkyl and alkoxy groups.

The different regions within such a polymer may be provided along the polymer backbone, as per U.S. Pat. No. 6,353,083, or as groups pendant from the polymer backbone as per WO 01/62869.

A single polymer or a plurality of polymers may be deposited from solution to form layer 5. Suitable solvents for polyarylenes, in particular polyfluorenes, include mono- or poly-alkylbenzenes such as toluene and xylene. Particularly preferred solution deposition techniques are spin-coating and ink jet printing.

Ink jet printing is particularly suitable for high information content displays, in particular full colour displays. Ink jet printing of OLEDs is described in, for example, EP 0880303.

In some cases, distinct layers of the device may be formed by different methods, for example a hole injection and/or transport layer may be formed by spin-coating and an emissive layer may be deposited by ink jet printing.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

Numerous hosts are described in the prior art including "small molecule" hosts such as 4,4'-bis(carbazol-9-yl)biphenyl), known as CBP, and (4,4',4"-tris(carbazol-9-yl)triphenylamine), known as TCTA, disclosed in Ikai et al. (Appl. Phys. Lett., 79 no. 2, 2001, 156); and triarylamines such as tris-4-(N-3-methylphenyl-N-phenyl)phenylamine, known as MTDATA. Polymers are also known as hosts, in particular homopolymers such as poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinyl-benzyloxyethyl, N-methylamino)-N-(2,5-di-tert-butylphenylnapthalimide] in Adv. Mater. 1999, 11(4), 285; and poly (para-phenylenes) in J. Mater. Chem. 2003, 13, 50-55. Copolymers are also known as hosts.

The emissive species may be metal complexes. The metal complexes may comprise optionally substituted complexes of formula (22):

$$ML^1_q L^2_r L^3_s \quad (22)$$

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet states (phosphorescence). Suitable heavy metals M include: lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals form organometallic complexes with carbon or nitrogen donors such as porphyrin or bidentate ligands of formula (VI):

(VI)

wherein Ar⁴ and Ar⁵ may be the same or different and are independently selected from optionally substituted aryl or heteroaryl; $X^1$ and $Y^1$ may be the same or different and are independently selected from carbon or nitrogen; and Ar⁴ and Ar⁵ may be fused together. Ligands wherein $X^1$ is carbon and $Y^1$ is nitrogen are particularly preferred.

Examples of bidentate ligands are illustrated below:

Each of Ar⁴ and Ar⁵ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed at WO 02/66552. Preferred dendrons include at least partially conjugated dendrons as disclosed in WO02/66552.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission colour is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014]. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

Device Manufacturing Procedure

The procedure follows the steps outlined below:

1) Depositing a PEDT/PSS composition onto indium tin oxide supported on a glass substrate (available from Applied Films, Colorado, USA) by spin coating.

2) Depositing a layer of hole transporting polymer by spin coating from xylene solution having a concentration of 2% w/v.

3) Heating the layer of hole transport material in an inert (nitrogen) environment.

4) Optionally spin-rinsing the substrate in xylene to remove any remaining soluble hole transport material.

5) Depositing an organic light-emissive material comprising a host material and an organic phosphorescent material by ink jet printing according to the invention.

6) Depositing a metal compound/conductive material bilayer cathode over the organic light-emissive material and encapsulating the device using an airtight metal enclosure available from Saes Getters SpA.

Full Colour Display Manufacturing Procedure

A full colour display can be formed according to the process described in EP 0880303 by forming wells for red, green and blue subpixels using standard lithographical techniques; ink jet printing PEDT/PSS into each subpixel well; ink jet printing hole transport material; and ink jet printing red, green and blue electroluminescent materials into wells for red, green and blue subpixels respectively.

As an alternative to wells, the photoresist may be patterned to form other types of openings into which the active layers may be selectively deposited. In particular, the photoresist may be patterned to form channels which, unlike wells, extend over a plurality of pixels and which may be closed or open at the channel ends, as disclosed in, for example, Carter et al, Proceedings of SPIE Vol. 4800, p. 34.

EXAMPLES

The ability to ink jet high solids content compositions containing host polymer in the presence and absence of an emissive metal complex was tested.

Example 1

A composition was formulated which contained 95% of a fluorene-based host material and 5% by weight of emitter. The host material was emissive in the blue range of wavelengths and comprised fluorene units of formula 1 and amine units of formula 2. The emitter was an iridium-based compound as described in WO 2006/062226.

The composition was made up to 1.6% by weight of solids in a mixture 50/50 v/v phenylnonane/4-methylanisole blend. The viscosity of the composition was measured using a controlled stress rheometer with cone and plate geometry at 20° C. to be 17.5 mPa·s.

Example 2

The composition according to Example 1 was made up to 1.5% by weight of solids in butylbenzoate/methylbenzoate/4-methylanisole 40/40/20 v/v. The viscosity of the composition was 17.5 mPa·s.

Example 3

A second composition was formulated which contained 95% of a different fluorene-based host material and 5% by weight of a different emitter. The host material was emissive in the blue range of wavelengths and comprised fluorene units of formula 1 and amine units of formula 2. The emitter was an iridium-based compound as described in WO 2006/062226.

The composition was made up to 1% by weight of solids in a mixture 50/50 v/v phenylnonane/4-methylanisole blend. The viscosity of the composition was measured using a controlled stress rheometer with cone and plate geometry at 20° C. to be 15.0 mPa·s.

Jetting performance was measured using a Litrex 80L printer with Dimatix SX3 head (128 nozzles). Ink was degassed under vacuum and using ultrasonication for 30 minutes prior to the ink being put on the printer. The head was flushed with at least 10 ml of ink and then left to equilibrate for one hour prior to testing. The drop velocity was adjusted to obtain ligament length of <300 microns and at this drop velocity the drop directionality was measured as a function of frequency and time.

In one case, at 2 kHz the drop directionality was measured after zero minutes and after 30 minutes continuous jetting. In another case, at 4 kHz the drop directionality was measured after zero minutes and after 10 minutes continuous jetting. Drop directionality is measured across the whole head (for all 128 nozzles). The drop directionality is measured by assessing the drop position at two points, the drop image being obtained using a strobe and camera set up. Each individual measurement is an average of the directionality of 10 drops.

Figure 4A:
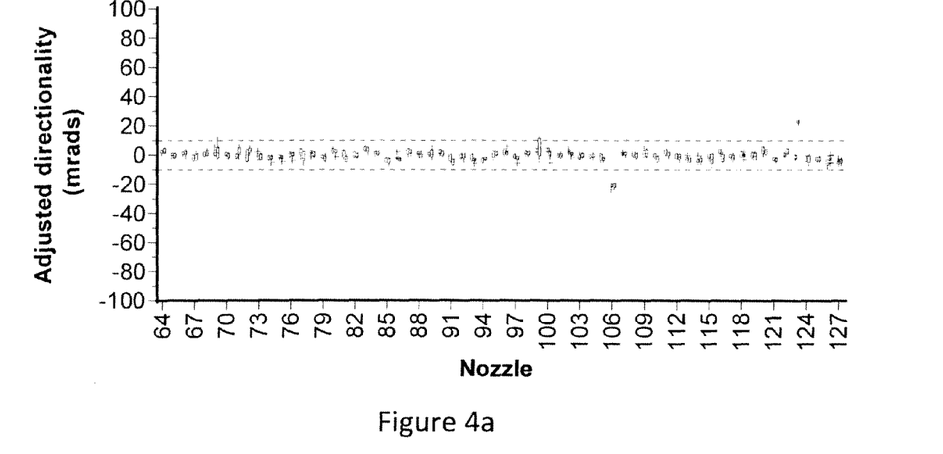
FIGS. 4a and 4b show jetting directionality at 2 kHz of, respectively, a composition according to the invention and a comparative example.

FIG. 4a illustrates the directionality using a composition of Example 1 at 2 kHz, measured at 0 and 30 minutes. As can be seen, the directionality is excellent, with virtually all nozzles print within a small window of ±10 milliradians.

Figure 4B:
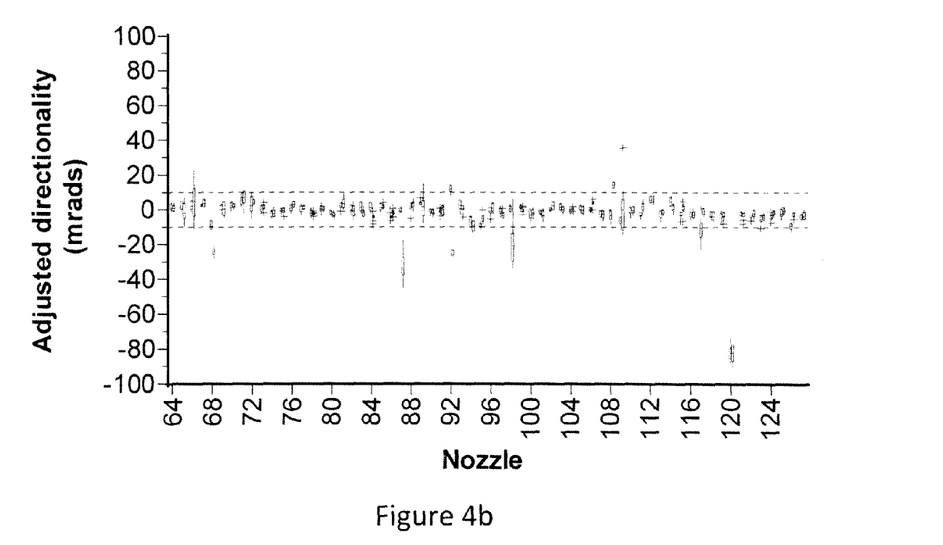

FIG. 4b illustrates the directionality of a comparative example that is the same Example 1, except that the metal complex is not present, and the viscosity of the composition is slightly lower (17 mPa·s). In this case, it can be seen that directionality is poor, even though the comparative composition has lower viscosity than the composition of Example 1. In particular, the directionality deteriorated significantly over time, and many of the points outside the window are from drops jetted at 30 minutes.

Figure 5A:
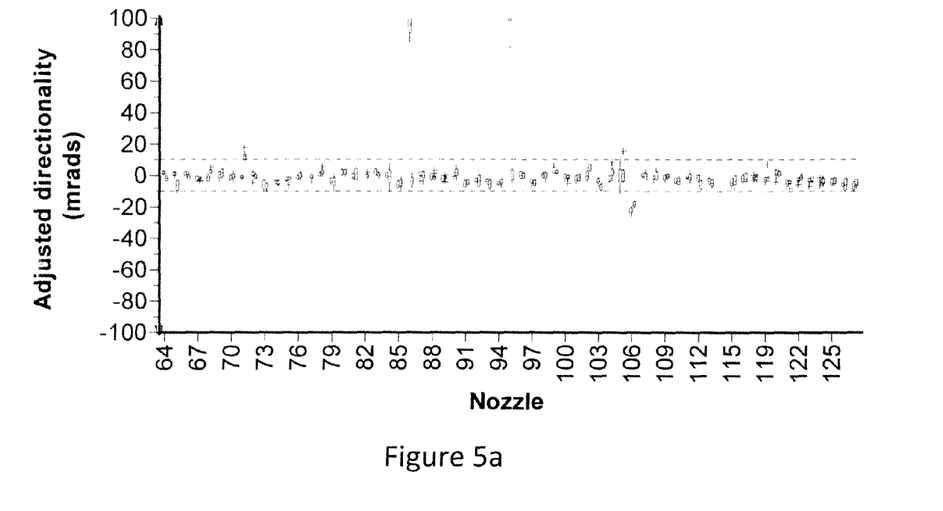
FIGS. 5a and 5b show jetting directionality at 4 kHz of, respectively, a composition according to the invention and a comparative example.
Figure 5B:
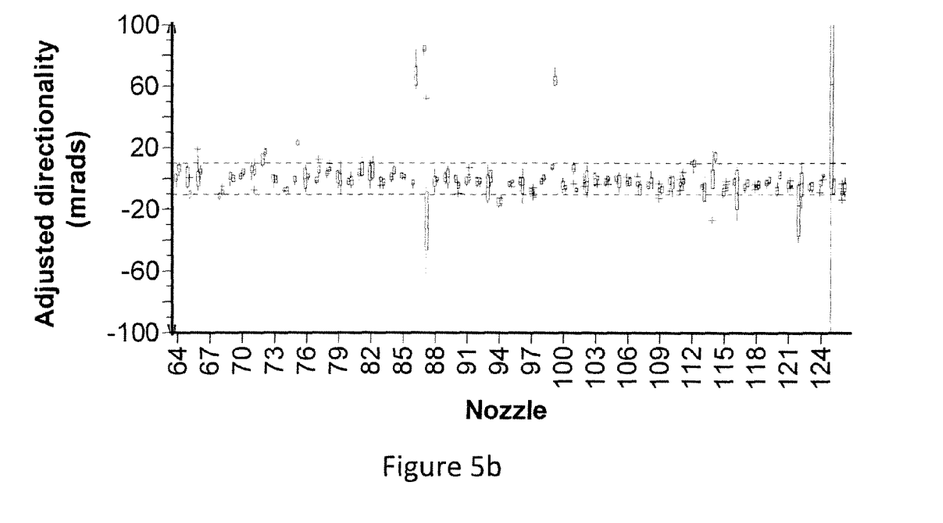

FIGS. 5a and 5b correspond to FIGS. 4a and 4b, except that the measurements were taken at 4 kHz and with directionality measured after 0 and 10 minutes.

Once again, it can be seen that the composition of the invention gives excellent directionality, whereas the directionality of the comparative composition is poor.

The composition of Example 2 also showed excellent directionality.

The directionality using the composition of Example 3 was measured at jetting frequencies of 0.5, 1, 2, 4 and 6 kHz and showed improved directionality at each frequency when compared to the directionality of the same composition in the absence of emitter.

The invention claimed is:

1. A composition for ink jet printing an opto-electrical device, which composition comprises a solution-processable host material, a metal complex, and a solvent, wherein the viscosity of the composition exceeds 16 mPa·s at 20° C. and which composition has a solids content of at least 1% by weight of the composition, wherein the host material is a host polymer comprising a co-polymer having a first repeat unit selected from the group consisting of optionally substituted fluorene, optionally substituted spirofluorene, optionally substituted indenofluorene, optionally substituted phenylene, and optionally substituted oligo-phenylene, and a further repeat unit comprising an optionally substituted triarylamine as shown in the following formula:

in which each Ar is the same or different and independently represents an optionally substituted aryl or heteroaryl and any two Ar groups may be directly linked by a divalent group or a single bond; —(CR$^4$R$^5$)$_n$— or —Ar$^1$—(CR$^4$R$^5$)$_n$—Ar$^2$— in which R$^4$ and R$^5$ are independently selected from hydrogen or a substituent, n is from 1 to 10, and Ar$^1$ and Ar$^2$ are independently selected from optionally substituted aryl or heteroaryl, and wherein the metal complex comprises a metal selected from the group consisting of ruthenium, rhodium, palladium, rhenium, osmium, iridium, platinum, and gold, and wherein the solvent is selected from the group consisting of phenylnonane, 4-methylanisole, optionally substituted benzoates, and mixtures thereof.

2. A composition according to claim 1, wherein the metal complex is an emissive metal complex.

3. A composition according to claim 2, wherein the emissive metal complex comprises an optionally substituted complex having the following general formula:

wherein M is a metal; each of L$^1$, L$^2$ and L$^3$ is a coordinating group; q is an integer; r and s are each independently 0 or an integer; and the sum of (a. q)+(b. r)+(c.s) is equal to the number of coordination sites available on M, wherein a is the number of coordination sites on L$^1$, b is the number of coordination sites on L$^2$ and c is the number of coordination sites on L$^3$.

4. A composition according to claim 1, wherein the host polymer comprises a polyfluorene copolymer.

5. A process for the manufacture of an organic light-emissive display comprising:
providing a substrate comprising a first electrode layer and a bank structure defining a plurality of wells;
depositing a conductive organic layer over the first electrode;
depositing an organic light-emissive layer over the conductive organic layer; and
depositing a second electrode over the organic light-emissive layer,
wherein the organic light-emissive layer is deposited by ink jet printing a composition according to claim 2 into the plurality of wells.

6. An organic light-emissive display obtained by the process of claim 5.

* * * * *